US007478021B2

(12) United States Patent
Shih

(10) Patent No.: US 7,478,021 B2
(45) Date of Patent: Jan. 13, 2009

(54) METHOD AND MEANS FOR GENERATING HIGH-ORDER HERMITE FUNCTIONS FOR SIMULATION OF ELECTROMAGNETIC WAVE DEVICES

(75) Inventor: Chun-Ching Shih, Palos Verdes Estates, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 568 days.

(21) Appl. No.: 11/074,455

(22) Filed: Mar. 7, 2005

(65) Prior Publication Data
US 2006/0200324 A1 Sep. 7, 2006

(51) Int. Cl.
*G06F 17/10* (2006.01)
(52) U.S. Cl. .......................................... 703/2; 342/22
(58) Field of Classification Search ................ 703/2; 342/22, 204
See application file for complete search history.

(56) References Cited

U.S. PATENT DOCUMENTS 5,486,833 A * 1/1996 Barrett ....................... 342/204
2004/0178942 A1 * 9/2004 McLemore .................. 342/22

OTHER PUBLICATIONS

Mink et al., J.W. A Hybrid Dielectric Slab-Beam Waveguide for the Sub-Millimeter Wave Region, IEEE Transactions on Microwave Theory and Techniques, vol. 41, No. 10, Oct. 1993, pp. 1720-1729.*
Yuan, F.Y. Electromagnetic Modeling and Signal Integrity Simulation of Power/Ground Networks in High Speed Digital Packages and Printed Circuit Boards, Proceedings of the 35th Annual Conference on Design Automation DAC '98, May 1998, pp. 421-426.*
Cerri et al., G. Evaluation of Electromagnetic Power Deposition in a Spherical Multilayer Head in the Near Field of a Linear Antenna, Wireless Networks, Nov. 1997, pp. 499-510.*
Cheng et al., An Interactive Remote Visualization Environment for an Electromagnetic Scattering Simulation on a High Performance Computing System, Proceedings of the 1993 ACM/IEEE Conference on Supercomputing, Dec. 1993, pp. 317-326.*
Phillips et al., J.R. Efficient Full-Wave Electromagnetic Analysis via Model-Order Reduction of Fast Integral Transforms, Proceedings of the 33rd Annual Conference on Design Automation DAC '96, Jun. 1996, pp. 1-6.*
Phillips et al., J.R. Efficient Full Wave Electromagnetic Analysis Via Model-Order Reduction of Fast Integral Transforms, Proceedings of the 33rd Annual Conference on Design Automation DAC '96, Jun. 1996, pp. 1-6.*

(Continued)

*Primary Examiner*—Russell Frejd
(74) *Attorney, Agent, or Firm*—Tarolli, Sundheim, Covell & Tummino LLP

(57) ABSTRACT

A technique for generating very-high-order Hermite functions needed for accurately simulating operation of various devices and structures involving propagation of electromagnetic waves. By using modified recursion formulas, the technique generates asymptotic Hermite functions, smooth Hermite functions or optimized smooth Hermite functions, allowing for very high orders of the functions to be generated without the intermediate function values becoming so large as to exceed the capacity of conventional computers. The disclosed method for generating smooth Hermite functions provides for generation of well-behaved functions of order 30,000 or higher.

21 Claims, 4 Drawing Sheets

OTHER PUBLICATIONS

Kralicek et al., P. Modeling Electromagnetic Emission of Integrated Circuits for System Analysis, Proceedings of the Conference on Design, Automation and Test in Europe DATE '01, Mar. 2001, pp. 336-340.*

Kimura et al., H. A Unified Technique for PCB/MCM Design by Combining Electromagnetic Field Analysis with Circuit Simulator, Proceedings of the Conference on Desighn, Automation and Test in Europe DATE '98, Feb. 1998, pp. 951-952.*

* cited by examiner

METHOD AND MEANS FOR GENERATING HIGH-ORDER HERMITE FUNCTIONS FOR SIMULATION OF ELECTROMAGNETIC WAVE DEVICES

This invention was made with Government support under contract F29601-97-C-0001 awarded by the United States Air Force. The government has certain rights in this invention.

BACKGROUND OF THE INVENTION

This invention relates generally to techniques for generating very high-order Hermite functions and, more particularly, to the generation of high-order Hermite-Gaussian functions for use in simulating operation of various devices in which electromagnetic waves are propagated in a cavity or in free space. Hermite functions, usually indicated by $H_n(x)$, have been used extensively in the construction of antenna patterns, in the representation of laser beams and in the simulation of electromagnetic wave behavior in stable laser cavities. Mathematical representation of electromagnetic (EM) waves is difficult because EM waves typically behave in a complex manner involving many modes of propagation. It is well known that Hermite functions can be used in the simulation of EM wave behavior in various environments, and that the accuracy of the mathematical representation is dependent on the extent to which higher-order Hermite functions can be generated. In particular, the accuracy of the mathematical representation is increased by the use of higher-order Hermite functions.

The Hermite function is a polynomial that can be generated for order n+1 from the same functions generated for order n and order n−1, using a classic recursion formula:

$$H_{n+1}(x) = 2xH_n(x) - 2nH_{n-1}(x).$$

All higher-order polynomials can, therefore, be generated from the zero-order Hermite function, $H_0(x)=1$. For almost any value of x, the resulting values of the Hermite functions increase very rapidly with n, and increase especially rapidly when x is large. To reduce the functions to a manageable magnitude, the Hermite functions are usually normalized according to the Hermite-Gaussian function, which is defined as:

$$G_n(x) = e^{-x^2} \tilde{H}_n(\sqrt{2}x) \text{ and } \tilde{H}_n(x) = H_n(x)/\sqrt{2^n n! \sqrt{\pi}}.$$

where $G_n(x)$ is the order-n Hermite-Gaussian function of x and $\tilde{H}_n(x)$ is the normalized order-n Hermite function of x.

The Hermite-Gaussian function, $G_n(x)$, has a finite and oscillating dependence on x up to $x \sim (n+1)^{1/2}$. FIGS. 1A-1D depict computed Hermite-Gaussian functions for n=10, 50, 200 and 250, respectively, each plotting the function value for increasing positive and negative values of x (along the horizontal axis). These graphs were generated using a commercially available mathematical software package (MATHEMATICA®). In general, each graph shows the finite and oscillating dependence on x up to $x \sim (n+1)^{1/2}$. For example, the Hermite-Gaussian function for n=10 oscillates regularly up to x~3, as shown in FIG. 1A, and for n=50 up to x~7, as shown in FIG. 1B. For the highest order shown (n=250, in FIG. 1D), the Hermite-Gaussian function generated begins to show a rapid increase in magnitude and irregular variations before reaching the x value of $251^{1/2}$ (~16). In other words, the generating process completely breaks down in this case. The graph of FIG. 1D is, in fact, an illustration of a critical hardware limitation in the generation of high-order Hermite-Gaussian functions. Most computers currently manufactured for scientific calculations employ a 32-bit or 64-bit word length for storage and computation. The largest number that can be stored in the 64-bit format is determined-by the format used for the numbers stored. In a widely used standard for floating-point numbers, promulgated by the IEEE (Institute for Electrical and Electronics Engineers), the 64-bit word includes one sign bit, an 11-bit exponent and a 52-bit fraction. In this format the largest number that can be stored in a 64-bit word is approximately $2^{\vee 1023} \sim 10^{\vee 308}$.

One possible solution to this hardware limitation is to employ the multiprecision computation system proposed by David H. Bailey of NASA (National Aeronautics and Space Administration). For details, see a paper by David H. Bailey entitled "Fortran-90 Based Multiprecision System," RNR Technical Report RNR-94-013, Jun. 6, 1994. Basically, the Bailey system allows the number of precision digits to be increased into the millions. The disadvantages of this software solution are that it requires the use of Fortran-90 and an external library, and, when implemented, it runs much slower than the conventional Hermite function generator.

Alternatively an improvement can be realized with the use of the recursion formula for normalized Hermite functions. This recursion formula defines the normalized Hermite function of order n+1 as:

$$\tilde{H}_{n+1}(x) = [\sqrt{2}x\tilde{H}_n(x) - \sqrt{n}\tilde{H}_{n-1}(x)]/\sqrt{n+1}.$$

This formula is able to push the recursive generation of Hermite functions to a higher order than if the classic recursion formula is used, but not much higher, and certainly not high enough to meet the needs of many applications involving simulation and analysis of electromagnetic wave phenomena.

It will be appreciated from the foregoing that there is still a need for a new approach for generation of Hermite functions of very high order, such as n greater than 10.000. Improvements in the generation of Hermite functions prior to this invention have not been able to reach anywhere near this goal because higher order Hermite functions become so large as to exceed the computational limits of conventional computers. Therefore, there is a need for a modified Hermite function generator that results in functions that are "well behaved" even at orders n much greater than 10,000. The present invention satisfies this need.

SUMMARY OF THE INVENTION

The present invention resides in a technique for generating Hermite functions of a new form, such that the functions generated at very high orders are within manageable magnitudes that can be represented in conventional computers. One form of the invention is a method for simulating operation of a device employing an electromagnetic wave phenomenon. Briefly, and in general terms, the method comprises the steps of inputting physical parameters of the device; generating a series of order-zero through order-n Hermite functions that have manageable values at very high values of n; simulating operation of the device to a high degree of accuracy by making use of the generated high-order Hermite functions; and outputting performance characteristics of the device. The generating step comprises applying a recursion formula to generate successively higher order Hermite functions. The recursion formula generates manageable values up to an order n of at least several thousand.

In accordance with other embodiments of the invention, variations of the recursion formula provide for generation of smooth Hermite functions and optimized smooth Hermite functions, allowing generation of such functions up an order of 30,000 and beyond.

In terms of apparatus, the invention may be also be defined as a programmable computer for simulating operation of a device employing an electromagnetic wave phenomenon, the programmable computer comprising means for inputting physical parameters of the device; means for generating a series of order zero through order n Hermite functions that have manageable values at very high values of n; means for simulating operation of the device to a high degree of accuracy by making use of the generated high-order Hermite functions; and means for outputting performance characteristics of the device. The means for generating comprises means for applying a recursion formula to generate successively higher order Hermite functions, and the recursion formula generates manageable values up to an order n of at least several thousand, or, if the smooth recursion formula is used, up to at least 30,000.

Generation of Hermite functions at these very high orders has long been needed in various fields relating to simulation and analysis of electromagnetic wave propagation, either within devices or structures, or in free space. Therefore, it will be appreciated that the present invention represents a significant advance in the study and design of devices utilizing electromagnetic waves. In particular, the generation of Hermite functions of very high order leads to improved accuracy in modeling the behavior of electromagnetic wave propagation in its various modes. Other aspects and advantages of the invention will become apparent from the following more detailed description of the invention, taken in conjunction with the accompanying drawings.

DETAILED DESCRIPTION OF THE INVENTION

Figure 1A:
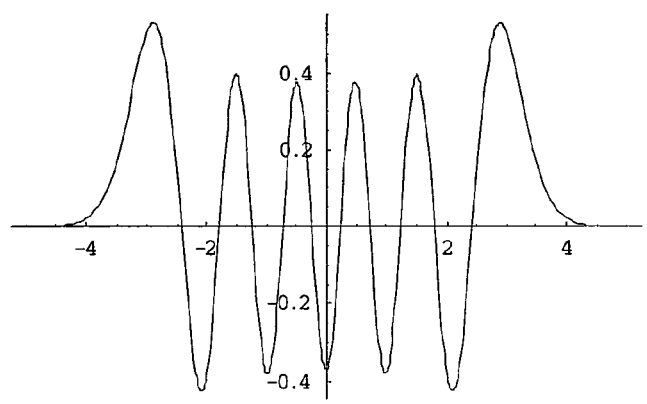
FIGS. 1A-1D are graphs depicting the variation of a Hermite-Gaussian function $G_n(x)$ as x is varies positively and negatively, for order n=10, 50, 200 and 250, respectively.
Figure 1B:
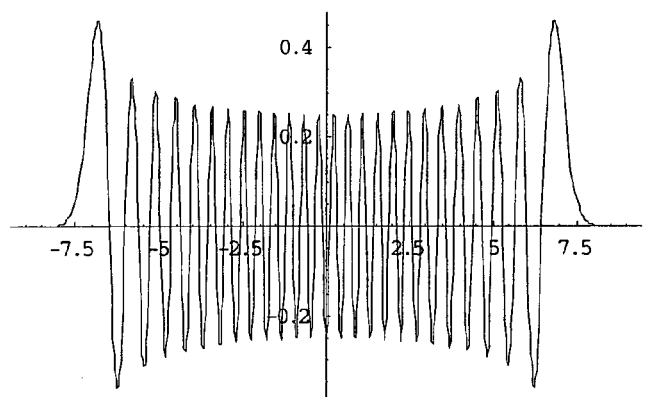
Figure 1C:
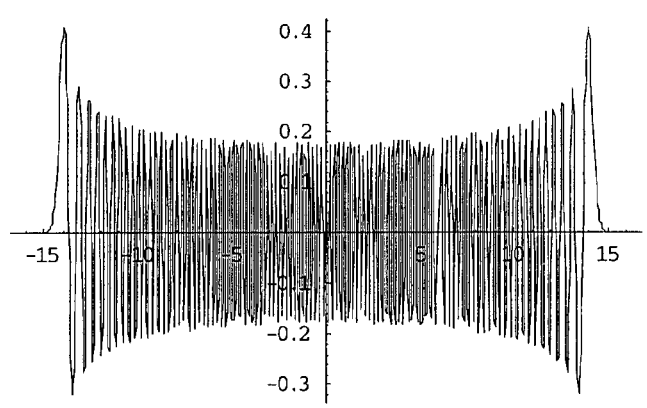
Figure 1D:
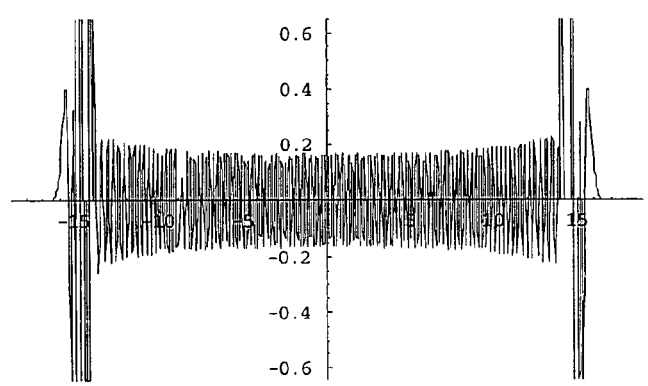
Figure 2:
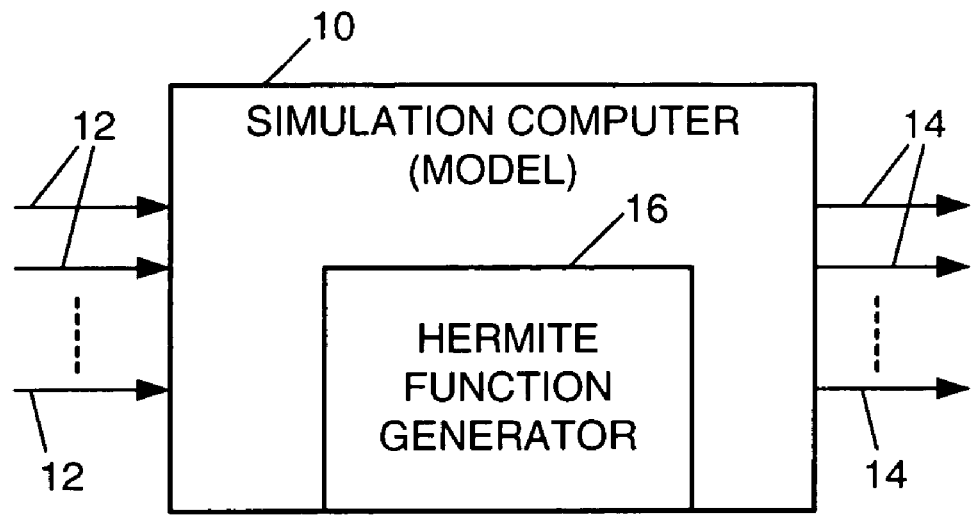
FIG. 2 is a simplified block diagram depicting the function of a simulation computer or model including a classic Hermite-Gaussian function generator.

As shown in the drawings for purposes of illustration, the present invention pertains to an improved technique for generating Hermite or Hermite-Gaussian functions for use in a simulation or modeling computer. As shown in FIG. 2, a simulation computer or model 10 has the general function of manipulating a plurality of input signals 12 representative of physical parameters of a device or structure to be simulated, and generating a plurality of output signals 14 representative of the performance characteristics of the device or structure. For many simulation or modeling applications in which the device or structure to be simulated involves the propagation of electromagnetic waves, the simulation computer 10 necessarily includes a Hermite-Gaussian function generator 16. Prior to the present invention, the function generator 16 was unable to generate Hermite or Hermite-Gaussian functions that were "well behaved" at higher orders. That is to say, the generated function became impractically large in value at orders n far below those that were ideally desired for the accurate simulation or analysis of electromagnetic wave phenomena. Although better performance, in the form of higher orders n, could be achieved by using a normalized version of the Hermite function recursion formula, no-one prior to the present invention has been able to generate well behaved Hermite functions of very high order, such as n=10,000 or more.

Figure 3:
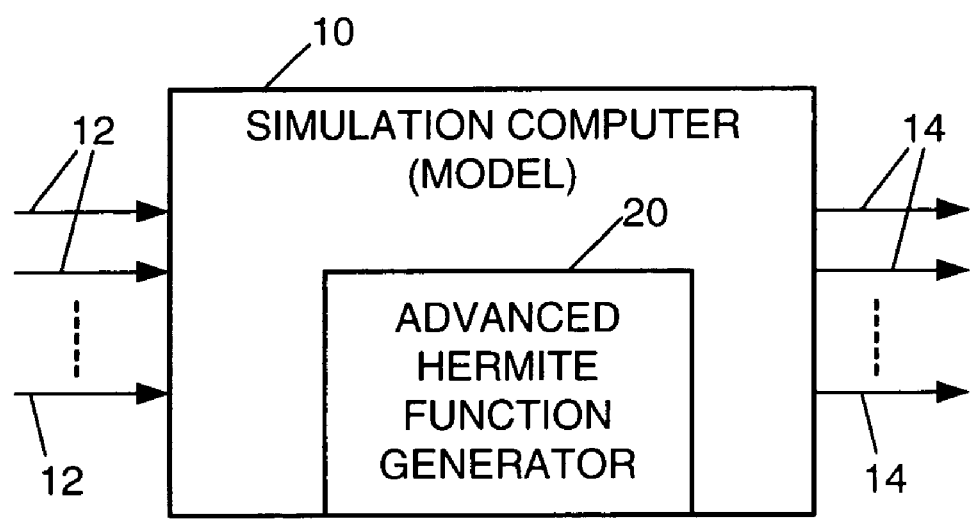
FIG. 3 is a simplified block diagram similar to FIG. 2, but including the advanced Hermite-Gaussian function generator of the present invention.

In accordance with the present invention, and as illustrated generally in FIG. 3, the simulation computer 10 includes an advanced Hermite-Gaussian function generator 20, capable of generating a function whose value remains manageably sized over a wide range of order n up to and into the tens of thousands. The following description explains in mathematical terms how the classic Hermite function generator is modified in accordance with the invention to achieve this performance goal.

A first level of performance improvement can be obtained by using an asymptotic Hermite function. First, it is noted that the highest order term in each Hermite function behaves as $H_n(x) \sim (2x)^n$. An asymptotic form of the function can be defined as:

$$\hat{H}_n(x) = \tilde{H}_n(x)\sqrt{n!}/\sqrt{2^n x^{2n}} = H_n(x)/[(2x)^n \pi^{1/4}],$$

where $\hat{H}_n(x)$ is the order-n asymptotic Hermite function of x and $\tilde{H}_n(x)$ is the order-n normalized Hermite function of x.

The asymptotic Hermite functions then follow a simpler recursion formula:

$$\hat{H}_{n+1}(x) = \hat{H}_n(x) - (n/2x^2)\hat{H}_{n-1}(x).$$

Figure 4:
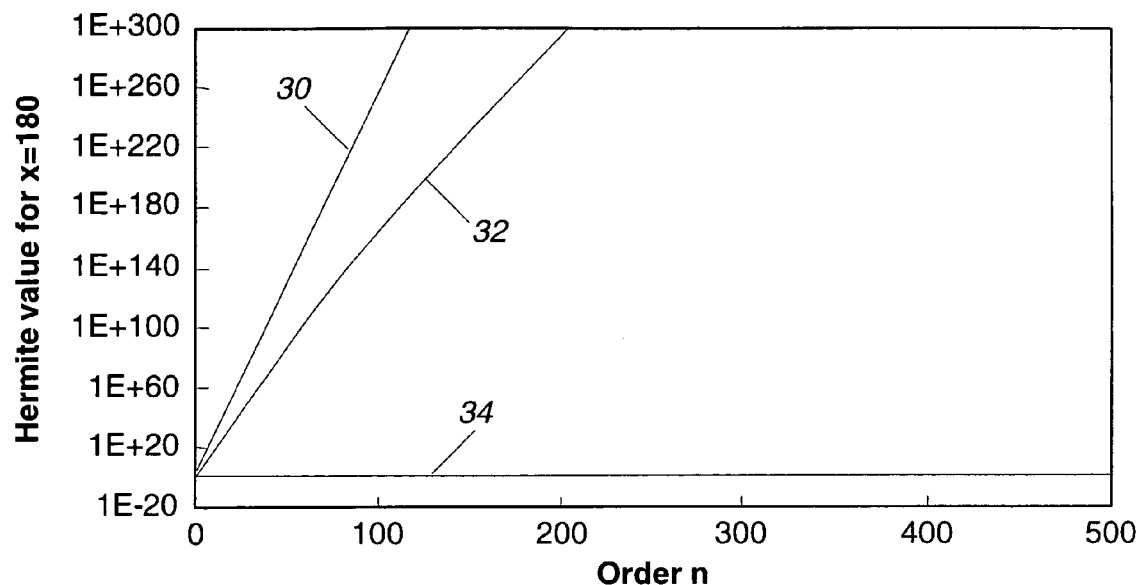
FIG. 4 is a graph comparing the performance of the classic Hermite function generator with the normalized Hermite function generator and an asymptotic Hermite function generator of the present invention, over a range of order n up to 500.

This results in a better-behaved function for higher orders n. FIG. 4 compares the function values of the classic Hermite function (curve 30), the normalized Hermite function (curve 32) and the asymptotic Hermite function (curve 34) for x=180~32,000$^{1/2}$. The latter curve is shown as essentially flat over a range of n up to 500. The asymptotic formula takes the Hermite function generation to an order n beyond ten thousands before the function value becomes too large to be manageable. This compares favorably with the classic Hermite function, the value of which exceeds conventional computational limits at about n=100, and the normalized Hermite function, which similarly fails at about n=200. Although the asymptotic form of the Hermite function pushes the useful range of the order n into the thousands, a much higher useful range would be desirable for many applications.

In accordance with an important aspect of the invention, a "smooth" Hermite function can be generated to an order n in the tens of thousands. It is noted from the recursion formula for the asymptotic Hermite function that for large values of x, the asymptotic Hermite function behaves like $\exp[-n(n-1)/4x^2]$, The "smooth" Hermite function is defined as:

$$\overline{H}_n(x) = \hat{H}_n(x)e^{n(n-1)/4x^2}.$$

The recursion formula for the smooth Hermite becomes:

$$\overline{H}_{n+1}(x)=\overline{H}_n(x)e^{n/2x^2}-(n/2x^2)\overline{H}_n(x)e^{(2n-1)/2x^2}.$$

Using this formula, one can easily extend the validity of recursive generation. To optimize the process, an adjustable parameter, a, is introduced into the exponential expression, and the following relationships apply:

$$\overline{H}_n(x)=\hat{H}_n(x)e^{n(n-1)/ax^2} \text{ and } \overline{H}_{n+1}(x)=\overline{H}_n(x)e^{2n/ax^2}-(n/2x^2)\overline{H}_n(x)e^{(4n-2)/ax^2}.$$

Figure 5:
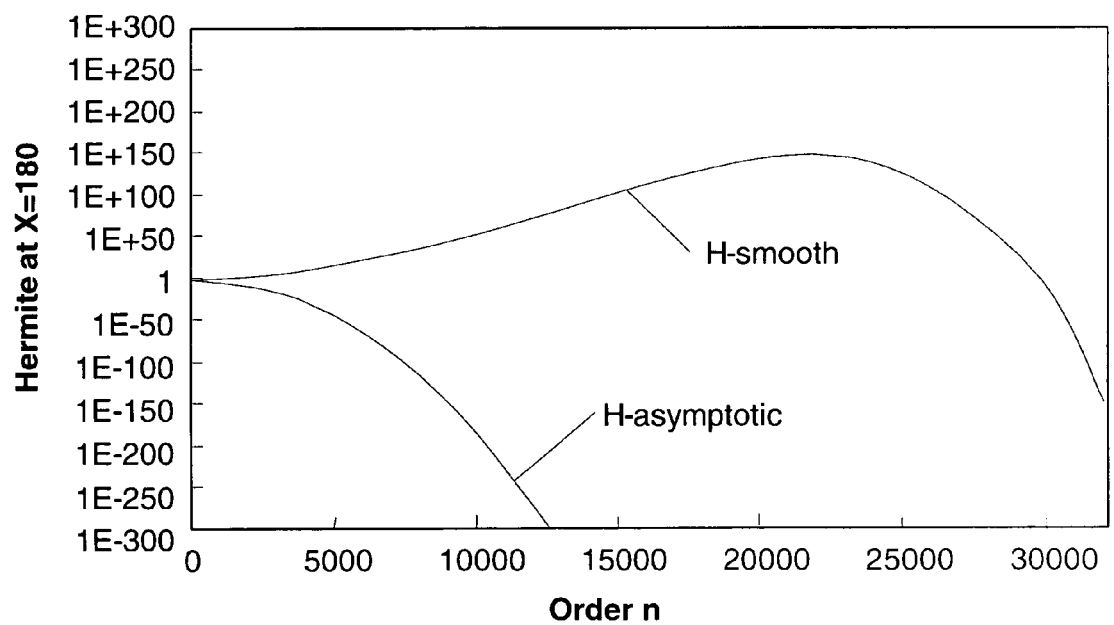
FIG. 5 is a graph comparing the performance of the asymptotic Hermite function with a smooth Hermite function generator in accordance with the invention, over a range of n up to 30,000.

Using a value of a=2.8 gives the best result, in that the function values for very high orders are well within the level of machine accuracy (and do not exceed $10^{\sqrt{150}}$). FIG. 5 compares the values for the smooth Hermite function with corresponding values for the asymptotic Hermite function, both at x=180. The asymptotic Hermite function fails (becomes unstably large) at order n~13,000, but the smooth Hermite function is well behaved at values of n beyond 32,000. Moreover, none of the function values over this range exceed the machine limit.

After the generation of a smooth Hermite function, the extra factor can be easily added back to obtain the normal values of Hermite-Gaussian functions in a relatively simple manner, as will now be explained in more detail.

The Hermite-Gaussian function is related to the smooth Hermite function as:

$$G_n(x) = e^{-x^2}H_n(\sqrt{2}\,x)/\sqrt{2^n n!\sqrt{\pi}}$$
$$= e^{-x^2}\hat{H}_n(\sqrt{2}\,x)(2x)^n/\sqrt{n!}$$
$$= \left[e^{-x^2}e^{-n(n-1)/(2ax^2)}(2x)^n/\sqrt{n!}\,\right]\overline{H}_n(\sqrt{2}\,x)$$
$$= F_n(x)\overline{H}_n(\sqrt{2}\,x)$$

where the explicit factor function $F_n(x)$ is expected to be well behaved for all values of n and x, at least within a range of interest. To evaluate this factor function, one can consider the approximation $n! \approx \sqrt{2\pi n}\,n^n e^{-n}$ and transform $F_n(x)$ as follows:

$$F_n(x) = \left[e^{-x^2}e^{-n(n-1)/(2ax^2)}(2x)^n/\sqrt{n!}\,\right]$$
$$= \sqrt{\frac{n^n}{n!e^n}}\left[\sqrt{\frac{e}{n}}\,2xe^{-\frac{x^2}{n}-\frac{n-1}{2ax^2}}\right]^n$$
$$= C_n\left[e^{\left(\frac{1}{2}+\ln 2+\frac{1}{2}\ln\frac{x^2}{n}-\frac{x^2}{n}-\frac{n-1}{2ax^2}\right)}\right]^n = C_n[e^{f_n(x)}]^n$$

The function $f_n(x)$ is small enough for $x \sim n^{1/2}$ that the exponential can be evaluated within the machine limit of $10^{\sqrt{308}}$. The n-dependent constant $C_n$ can be obtained from the following recurrence formula:

$$C_n = \sqrt{\frac{1}{e}\left(\frac{n}{n-1}\right)^{n-1}}\,C_{n-1}$$

Figure 6:
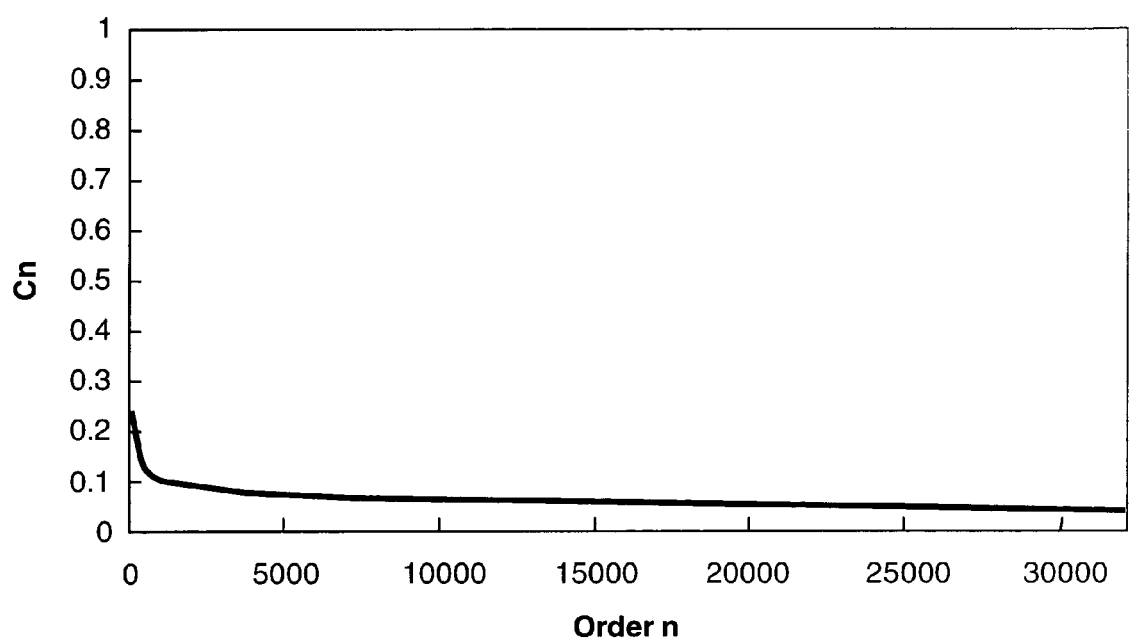
FIG. 6 is a graph showing the n-dependent variation of a "constant" ($C_n$) used to transform a smooth Hermite function to an equivalent Hermite-Gaussian function in accordance with one aspect of the invention.

As n proceeds to a very high value, $C_n$ varies from a value of 1 (at n=0) to a value of ~0.05 (for n=15,000 to more than 30,000). FIG. 6 shows this variation of $C_n$ over a wide range of order n. From the foregoing relationships, a generated smooth Hermite function can be converted into a corresponding Hermite-Gaussian function.

It will be appreciated from the foregoing that the present invention represents a significant advance in the field of computer simulation or modeling of electromagnetic waves and related devices in which or from which such waves are propagated. In particular, the invention provides a technique for generating Hermite-Gaussian functions to a very high order while maintaining the value of such functions well below the practical machine limit for holding large numerical quantities. These very high-order Hermite-Gaussian functions allow more accurate simulation or modeling of electromagnetic wave phenomena, in such contexts as antennas, laser cavities and free-space communication. It will also be appreciated that, although specific embodiments of the invention have been described in detail by way of example, various modifications may be made without departing from the spirit and scope of the invention. Accordingly, the invention should not be limited except as by the appended claims.

The invention claimed is:

1. A method for simulating operation of a device employing an electromagnetic wave phenomenon, the method comprising the steps of:
   inputting physical parameters of the device;
   generating a series of order zero through order n Hermite functions that have manageable values at very high values of n, wherein the generating step comprises applying a recursion formula to generate successively higher order Hermite functions, and wherein the recursion formula generates manageable values up to an order n of at least several thousands;
   simulating operation of the device by making use of the generated higher order Hermite functions; and
   outputting performance characteristics of the device.

2. A method as defined in claim 1, wherein:
   the step of generating a series of Hermite functions comprises generating asymptotic Hermite functions in accordance with a recursion formula expressed as $$\hat{H}_{n+1}(x)=\hat{H}_n(x)-(n/2x^2)\hat{H}_{n-1}(x),$$

where $\hat{H}_n(x)$ is the order-n asymptotic Hermite function of x.

3. A method as defined in claim 1, wherein:
   the step of generating a series of Hermite functions comprises generating smooth Hermite functions in accordance with a recursion formula expressed as $$\overline{H}_{n+1}(x)=\overline{H}_n(x)e^{n/2x^2}-(n/2x^2)\overline{H}_n(x)e^{(2n-1)/2x^2},$$

where $\overline{H}_n(x)$ is the order-n smooth Hermite function of x; and
   the smooth Hermite function recursion formula generates manageable values up to an order n of at least 20,000.

4. A method as defined in claim 1, wherein:
   the step of generating a series of Hermite functions comprises generating optimized smooth Hermite functions in accordance with a recursion formula expressed as:

$$\overline{H}_{n+1}(x)=\overline{H}_n(x)e^{2n/ax^2}-(n/2x^2)\overline{H}_n(x)e^{(4n-2)/ax^2},$$

where $\overline{H}_n(x)$ is the order-n optimized smooth Hermite function of x, and a is an adjustable parameter used to optimize generation of the smooth Hermite functions; and
   the optimized smooth Hermite function recursion formula generates manageable values up to an order n of at least 30,000.

5. A method as defined in claim 4, wherein a is approximately 2.8.

6. A method as defined in claim 4, and further comprising the step of:
   transforming each optimized smooth Hermite function into an equivalent Hermite-Gaussian function.

7. A method as defined in claim 6, wherein the transforming step is performed in accordance with the relation $$G_n(x) = F_n(x)\overline{H}_n(\sqrt{2}x),$$

where $G_n(x)$ is the order-n Hermite-Gaussian function of x, and $F_n(x)$ is a function of x defined as $$F_n(x) = C_n[e^{f_n(x)}]^n,$$

where $C_n$ is a constant dependent on n, and where $$f_n(x) = \frac{1}{2} + \ln 2 + \ln\frac{x^2}{n} - \frac{x^2}{n} - \frac{n-1}{2ax^2}.$$

8. A programmable computer for simulating operation of a device employing an electromagnetic wave phenomenon, the programmable computer including a Hermite-Gaussian function generator, the programmable computer comprising:
   means for inputting physical parameters of the device;
   means for generating a series of order zero through order n Hermite functions that have manageable values at very high values of n, wherein the means for generating comprises means for applying a recursion formula to generate successively higher order Hermite functions, and wherein the recursion formula generates manageable values up to an order n of at least several thousands;
   means for simulating operation of the device by making use of the generated higher order Hermite functions; and
   means for outputting performance characteristics of the device.

9. A programmable computer as defined in claim 8, wherein:
   the means for generating a series of Hermite functions comprises means for generating asymptotic Hermite functions in accordance with a recursion formula expressed as $$\hat{H}_{n+1}(x) = \hat{H}_n(x) - (n/2x^2)\hat{H}_{n-1}(x),$$

where $\hat{H}_n(x)$ is the order-n asymptotic Hermite function of x.

10. A programmable computer as defined in claim 8, wherein:
   the means for generating a series of Hermite functions comprises means for generating smooth Hermite functions in accordance with a recursion formula expressed as $$\overline{H}_{n+1}(x) = \overline{H}_n(x)e^{n/2x^2} - (n/2x^2)\overline{H}_n(x)e^{(2n-1)/2x^2},$$

where $\overline{H}_n(x)$ is the order-n smooth Hermite function of x; and
   the smooth Hermite function recursion formula generates manageable values up to an order n of at least 20,000.

11. A programmable computer as defined in claim 8, wherein:
   the means for generating a series of Hermite functions comprises means for optimized smooth Hermite functions in accordance with a recursion formula expressed as:

$$\overline{H}_{n+1}(x) = \overline{H}_n(x)e^{2n/ax^2} - (n/2x^2)\overline{H}_n(x)e^{(4n-2)/ax^2},$$

where $\overline{H}_n(x)$ is the order-n optimized smooth Hermite function of x, and a is an adjustable parameter used to optimize generation of the smooth Hermite functions; and
   the optimized smooth Hermite function recursion formula generates manageable values up to an order n of at least 30,000.

12. A programmable computer as defined in claim 11, wherein a is approximately 2.8.

13. A programmable computer as defined in claim 11, and further comprising:
   means for transforming each optimized smooth Hermite function into an equivalent Hermite-Gaussian function.

14. A programmable computer as defined in claim 13, wherein the means for transforming functions in accordance with the relation $$G_n(x) = F_n(x)\overline{H}_n(\sqrt{2}x),$$

where $G_n(x)$ is the order-n Hermite-Gaussian function of x, and $F_n(x)$ is a function of x defined as $$F_n(x) = C_n[e^{f_n(x)}]^n,$$

where $C_n$ is a constant dependent on n, and where $$f_n(x) = \frac{1}{2} + \ln 2 + \ln\frac{x^2}{n} - \frac{x^2}{n} - \frac{n-1}{2ax^2}.$$

15. A computer storage medium containing a software module operable to cause a computer to perform steps for simulating operation of a device employing an electromagnetic wave phenomenon, the computer performing the steps of:
   receiving physical parameters of the device;
   generating a series of order zero through order n Hermite functions that have manageable values at very high values of n, wherein the generating step comprises applying a recursion formula to generate successively higher order Hermite functions, and wherein the recursion formula generates manageable values up to an order n of at least several thousands; and
   outputting performance characteristics of the device based on the generated higher order Hermite functions.

16. A computer storage medium as defined in claim 15, wherein:
   the step of generating a series of Hermite functions comprises generating asymptotic Hermite functions in accordance with a recursion formula expressed as $$\hat{H}_{n+1}(x) = \hat{H}_n(x) - (n/2x^2)\hat{H}_{n-1}(x),$$

where $\hat{H}_n(x)$ is the order-n asymptotic Hermite function of x.

17. A computer storage medium as defined in claim 15, wherein:
   the step of generating a series of Hermite functions comprises generating smooth Hermite functions in accordance with a recursion formula expressed as $$\overline{H}_{n+1}(x) = \overline{H}_n(x)e^{n/2x^2} - (n/2x^2)\overline{H}_n(x)e^{(2n-1)/2x^2},$$

where $\overline{H}_n(x)$ is the order-n smooth Hermite function of x; and
   the smooth Hermite function recursion formula generates manageable values up to an order n of at least 20,000.

18. A computer storage medium as defined in claim 15, wherein:

the step of generating a series of Hermite functions comprises generating optimized smooth Hermite functions in accordance with a recursion formula expressed as:

$$\overline{H}_{n+1}(x)=\overline{H}_n(x)e^{2n/ax^2}-(n/2x^2)\overline{H}_n(x)e^{(4n-2)/ax^2},$$

where $\overline{H}_n(x)$ is the order-n optimized smooth Hermite function of x, and a is an adjustable parameter used to optimize generation of the smooth Hermite functions; and the optimized smooth Hermite function recursion formula generates manageable values up to an order n of at least 30,000.

19. A computer storage medium as defined in claim 18, wherein a is approximately 2.8.

20. A computer storage medium as defined in claim 18, and the steps further comprise:

transforming each optimized smooth Hermite function into an equivalent Hermite-Gaussian function.

21. A computer storage medium as defined in claim 20, wherein the transforming step is performed in accordance with the relation $$G_n(x)=F_n(x)\overline{H}_n(\sqrt{2}x),$$

where $G_n(x)$ is the order-n Hermite-Gaussian function of x, and $F_n(x)$ is a function of x defined as $$F_n(x)=C_n[e^{f_n(x)}]^n,$$

where $C_n$ is a constant dependent on n, and where $$f_n(x) = \frac{1}{2} + \ln 2 + \ln\frac{x^2}{n} - \frac{x^2}{n} - \frac{n-1}{2ax^2}.$$

* * * * *